United States Patent [19]
Sachs et al.

[11] Patent Number: 5,204,055
[45] Date of Patent: Apr. 20, 1993

[54] THREE-DIMENSIONAL PRINTING TECHNIQUES

[75] Inventors: Emanuel M. Sachs, Somerville; John S. Haggerty, Lincoln; Michael J. Cima, Lexington; Paul A. Williams, Concord, all of Mass.

[73] Assignee: Massachusetts Institute of Technology, Cambridge, Mass.

[21] Appl. No.: 447,677

[22] Filed: Dec. 8, 1989

[51] Int. Cl.⁵ .................. B22F 7/02; B29C 35/02; B29C 67/02; C04B 35/64
[52] U.S. Cl. ........................................ 419/2; 264/23; 264/25; 264/60; 264/69; 264/71; 264/113; 264/128; 419/5; 419/10
[58] Field of Search .................... 427/57, 197-199, 427/203-205, 14.1, 265, 266, 201, 202; 264/23, 25, 113, 128, 60, 71, 69; 419/2, 5, 10

[56] References Cited

U.S. PATENT DOCUMENTS

| | | | |
|---|---|---|---|
| 4,247,508 | 1/1981 | Housholder | 264/219 |
| 4,575,330 | 3/1986 | Hull | 425/174.4 |
| 4,665,492 | 5/1987 | Masters | 364/468 |
| 4,791,022 | 12/1988 | Graham | 427/203 X |
| 4,818,562 | 4/1989 | Arcella et al. | 427/197 X |
| 4,863,538 | 9/1989 | Deckard | 156/62.2 |
| 4,929,402 | 5/1990 | Hull | 264/22 |
| 5,121,329 | 6/1992 | Crump | 264/25 X |
| 5,147,587 | 9/1992 | Marcus et al. | 264/22 |

FOREIGN PATENT DOCUMENTS 226377 7/1973 Fed. Rep. of Germany .
WO90/03893 4/1990 World Int. Prop. O. .

OTHER PUBLICATIONS

Deckard, C. and Beaman, J., "Solid Freeform Fabrication and Selective Powder Sintering", NAMRAC Proceedings, Symposium #15, undated.
Kodama, H., "Automatic Method for Fabricating a Three-Dimensional Plastic Model with Photo-Hardening Polymer", Review of Scientific Instruments, vol. 52, No. 11, Nov. 1981.
Wohlers, Terry, "Creating Parts by the Layers", Cadence, Apr., 1989, pp. 73-76.

Primary Examiner—Evan Lawrence
Attorney, Agent, or Firm—Robert F. O'Connell

[57] ABSTRACT

A process for making a component by depositing a first layer of a fluent porous material, such as a powder, in a confined region and then depositing a binder material to selected regions of the layer of powder material to produce a layer of bonded powder material at the selected regions. Such steps are repeated a selected number of times to produce successive layers of selected regions of bonded powder material so as to form the desired component. The unbonded powder material is then removed. In some cases the component may be further processed as, for example, by heating it to further strengthen the bonding thereof.

42 Claims, 6 Drawing Sheets

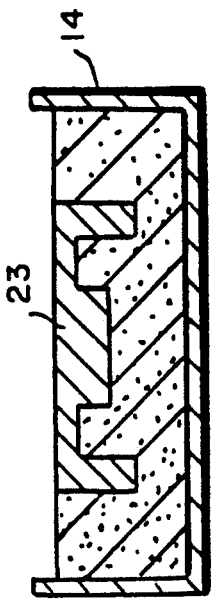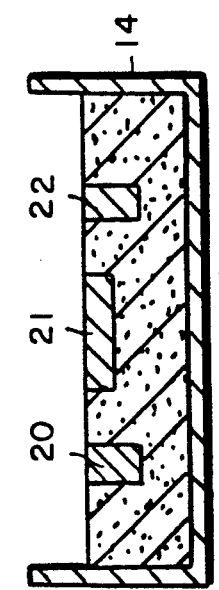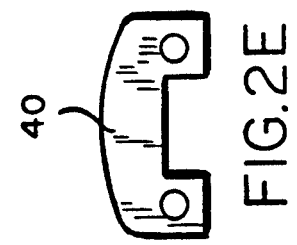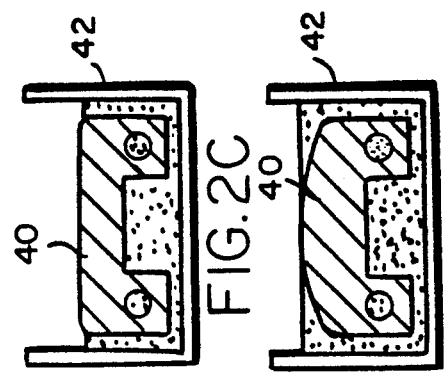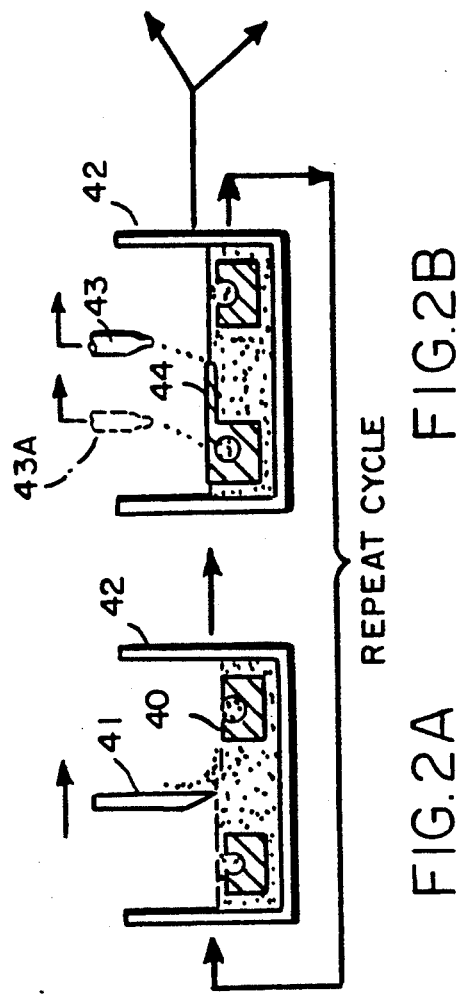

THREE-DIMENSIONAL PRINTING TECHNIQUES

INTRODUCTION

This invention relates generally to the manufacture of tooling and prototype parts and, more particularly, to the use of three-dimensional printing techniques using computer models therefor.

BACKGROUND OF THE INVENTION

Two needs in providing effective industrial productivity and competitiveness lie in the reduction in time required to bring new products to the marketplace and the need for providing for flexible manufacture of products in small quantities. Thus, it is desirable to provide rapid part turnaround with a minimal investment in tooling. Techniques for doing so should have the ability to tailor designs to specfic tasks, to shorten the cycle time from design to manufacturing, and/or to manufacture in very small lot sizes, as low as a single component, all at reasonable cost. A major contributor to the time required to bring new products to market is the time required to fabricate functioning prototypes. Rapid prototyping can shorten the product development cycle and improve the design process by providing rapid and effective feedback to the designer. Moreover, some applications require rapid prototyping of non-functional parts for use in assessing the aesthetic aspects of a design or the fit and assembly thereof.

Another major contributor to the time to bring a product to market is the time required to develop tooling, such as molds and dies. For some types of tooling, such as injection molding dies, the turnaround time for the design and fabrication of a tool routinely extends to several months. The long lead times are due to the fact that tooling is often one of a kind and can be extremely complex, requiring a great deal of human attention to detail. Thus, tooling not only affects lead time, but also manufacturing costs as well. In fact, tooling costs often determine the minimum economic batch size for a given process. Prototyping requirements, tooling lead time, and tooling cost are related in that it is the combination of long lead times and high cost which make it impractical to fabricate preproduction prototypes by the same process that will be used in production.

In the past several years, there has been considerable interest in developing computerized, three-dimensional printing techniques, sometimes referred to as "desktop manufacturing" techniques where no tooling is required. One such system is known, the SLA 1 System, made and sold by 3D Systems, Inc. of Valencia, Calif. This system operates on a principle called stereolithography wherein a focused ultra-violet (UV) laser is vector scanned over the top of a bath of a photopolymerizable liquid polymer plastic material. The UV laser causes the bath to polymerize where the laser beam strikes the surface of the bath, resulting in the creation of a first solid plastic layer at and just below the surface. The solid layer is then lowered into the bath and the laser generated polymerization process is repeated for the generation of the next layer, and so on, until a plurality of superimposed layers forming the desired part is obtained. The most recently created layer in each case is always lowered to a position for the creation of the next layer slightly below the surface of the liquid bath.

An alternative approach, sometimes called Selective Laser Sintering (SLS) has also been proposed by DTM Corporation of Austin, Texas. In such system, a laser beam is used to sinter areas of a layer of loosely compacted plastic powder, the powder being applied layer by layer. The term "sintering" refers to the process by which particulates, such as powdered plastics, are caused to adhere into a solid mass by means of externally applied energy. A SLS system uses the optical energy supplied by a laser for such purpose.

Thus, a thin layer of powder is spread evenly onto a flat surface with a roller mechanism. The thin powder surface is then raster-scanned with a high-power laser beam from above. The powder material that is struck by the laser beam is fused together. The areas not hit by the laser beam remain loose and fall from the part when it is removed from the system. Successive layers of powder are deposited and raster-scanned, one on top of another, until an entire part is complete. Each layer is sintered deeply enough to bond it to the preceding layer. A similar laser sintering approach has been proposed by Hydronetics, Inc. of Chicago, Ill. Another process suggested by the same company is designated as a Laminated Object Manufacturing (LOM) technique wherein thin metallic foil layers are cut out to appropriate shapes to form a part and the shaped layered pieces are laid one on top of the other and suitably bonded to form the part involved.

Another process suggested for creating 3D models and prototypes, sometimes called Ballistic Particle Manufacturing (BPM), has been proposed by Automated Dynamic Corporation of Troy, N.Y. This process uses an ink-jet printing technique wherein an ink-jet stream of liquid molten metal or a metal composite material is used to create three-dimensional objects under computer control, similar to the way an ink-jet printer produces two-dimensional graphic printing. A metal or metal composite part is produced by ink-jet printing of successive cross sections, one layer after another, to a target using a cold welding (i.e., rapid solidification) technique, which causes bonding between the particles and the successive layers.

Still another technique, sometimes called Photochemical Machining, proposed by Formigraphic Engine Co. of Berkeley, Calif., uses intersecting laser beams to selectively harden or soften a polymer plastic block. The underlying mechanism used is the photochemical cross-linking or degradation of the material.

It is desirable to devise a technique for providing such layered parts which will work satisfactorily with ceramic or metal materials, or combinations of such materials with each other or with other materials, but which will also work satisfactorily with plastic particles or with other inorganic materials. Such a technique could be more universally employed for the manufacture of components from a larger variety of materials than the currently proposed techniques.

SUMMARY OF THE INVENTION

In accordance with a preferred embodiment of the invention, powdered material, e.g., a powdered ceramic, a powdered metal, or a powdered plastic, is deposited in sequential layers one on top of the other. Following the deposit of each layer of powdered material, a liquid binder material is selectively supplied to the layer of powdered material using an ink-jet printing technique in accordance with a computer model of the three-dimensional part being formed. Following the sequential application of all of the required powder layers and binder material to form the part in question, the unbound powder is appropriately removed, resulting in the formation of the desired three-dimensional part. It is found that such technique permits complex metal, ceramic, or metal-ceramic composite parts to be effectively formed with a very high degree of resolution in a reasonably short time period.

Such technique should be particularly useful, for example, in providing for the rapid production of molds for metal casting and the rapid formation of pre-forms for metal matrix composites. Such technique can also be used with plastic materials to form plastic components or parts for various purposes.

BRIEF DESCRIPTION OF THE DRAWING

The invention can be described in more detail with the help of the accompanying drawings wherein

FIG. 2 shows diagrammatic views of different stages in forming a part in accordance with the invention;

FIGS. 7 and 8 show diagramatic views of the formation of a part having reentrant features;

DETAILED DESCRIPTION

Figure 1:
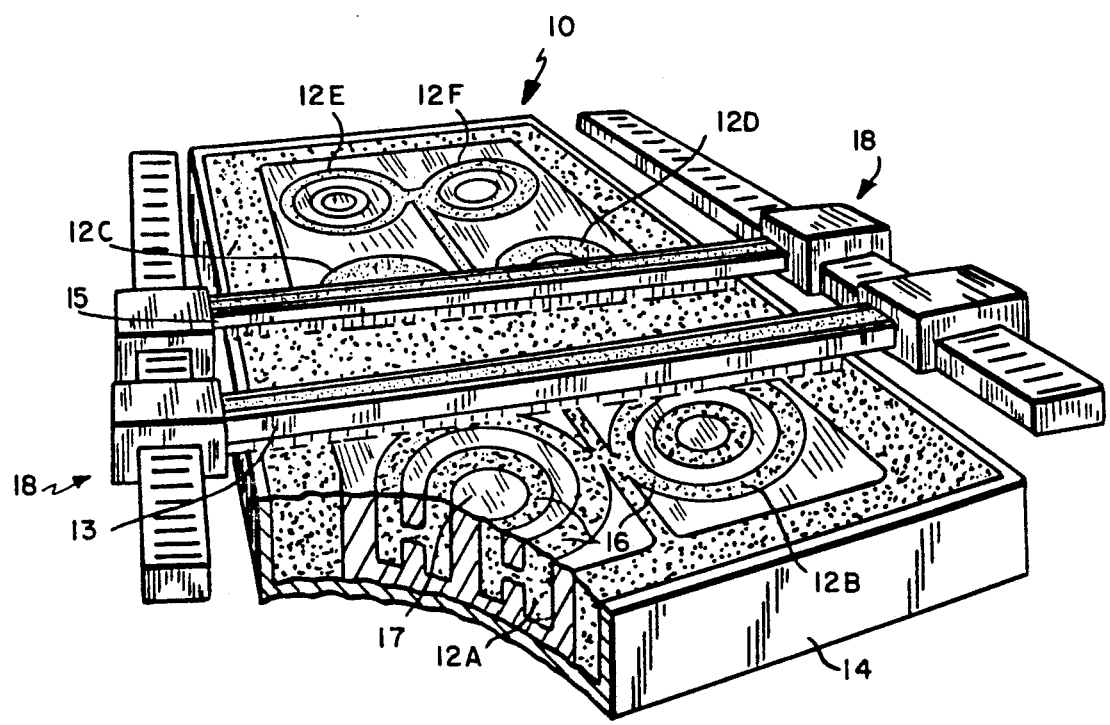
FIG. 1 shows an isometric view of one particular embodiment of the invention.

One particular embodiment of the invention is shown in FIG. 1 which depicts an apparatus 10 for forming a ceramic mold having six cavities 12A–12F which can be used for casting six substantially identical parts. A powder dispersion head 13 is driven reciprocally in a shuttle motion along the length of the mold being formed. A suitable linear stepping motor assembly 18 can be used for moving the powder distribution head 13 and the binder deposition head 15 (discussed below). The powdered material, e.g., a ceramic powder, is dispensed in a confined region, e.g., defined by a form 14, the powder being dispensed in a line as the dispensing head 13 is moved in discrete steps along the mold length to form a relatively loose layer thereof having a typical thickness of about 100–200 microns, for example. While the material is described here as a powdered material, in some applications it can be distributed in the form of fibers, for example. For convenience in describing the invention, the term powder material will be construed to include fiber material. The stepping motor can be moved at such high speeds that the motion of the head 13 will effectively be continuous in nature. Alternatively, the motor may be one which inherently provides a continuous motion, such as a servo-controlled motor. An initial layer is dispersed at the bottom of the form 14 and each subsequent layer is dispersed sequentially on the preceding layer.

An ink-jet print head 15 having a plurality of ink-jet dispensers is also driven by the stepping motor assembly in the same reciprocal manner so as to follow the motion of the powder head and to selectively produce jets of a liquid binder material at selected regions 16 which represent the walls of each cavity, thereby causing the powdered material at such regions to become bonded. The binder jets are dispensed along a line of the printhead 15 which is moved in substantially the same manner as the dispensing head 13 of the powder material, i.e., by a high speed stepping operation or by a continuous servo motor operation, in each case providing effectively continuous movement of head 15 as discussed above with reference to head 13. Typical binder droplet sizes are about 15–50 microns, for example. The powder/binder layer forming process is repeated so as to build up the mold parts layer by layer.

A diagram showing a part being fabricated in accordance with the invention is depicted in FIG. 2 which diagrammatically depicts the flow thereof. For a part 40 in question a layer of powder is deposited from a powder dispensing head 41 into a form 42 over a previously formed layer which has already had binder material deposited therein (A). A layer of binder material is then printed onto the powder layer from binding jet head 43 to form the next layer 44 of bonded powder articles (B). Such operation is repeated for each subsequent layer. An exemplary intermediate stage of the formation of part 40 is shown at (C). When the final bonded layer is printed as shown at (D), excess, unbonded powder is removed, the finally formed part itself being depicted at (E).

While the layers become hardened or at least partially hardened as each of the layers is laid down, once the desired final part configuration is achieved and the layering process is completed, in some applications it may be desirable that the form and its contents be heated or cured at a suitably selected temperature to futher promote binding of the powder particles. In either case, whether a further curing is or is not required, the loose, unbonded powder particles, e.g., at regions 17 (FIG. 1), are removed using a suitable technique, such as ultrasonic cleaning, for example, so as to leave a finished part for use.

For effective use, the powder particles should be uniformly deposited at a relatively high rate, the rate being selected in accordance with the application for which the technique is used. For many useful applications the powder particles can preferably be packed at relatively high densities, while in other applications the density may be considerably lower where parts having greater porosity are desired. Known techniques used in the fields of colloidal science and powder dispersion chemistry can be used to provide the desired uniform depositions of such powders at the required rates and densities. Thus, such powders can be dispensed either as dry powders or in a liquid vehicle, such as in a colloidal dispersant or in an aqueous suspension. In the dry state, the desired compaction of particles can be achieved using mechanical vibrating compaction techniques or by applying acoustic energy, i.e., either sonic or ultrasonic vibrations, to the deposited powder or by applying a piezoelectric scraper to the deposited powder.

Figure 3:
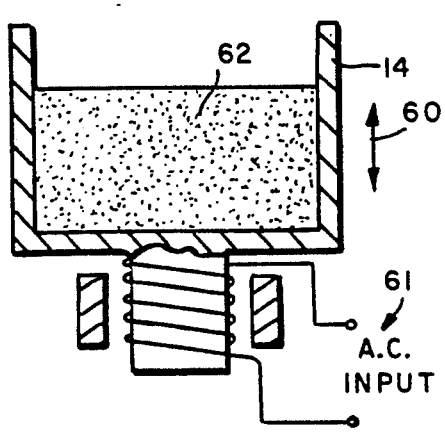
FIG. 3, 4 and 5 show various exemplary techniques for setting the powder particles by applying mechanical vibrations and acoustic energy thereto.
Figure 5:
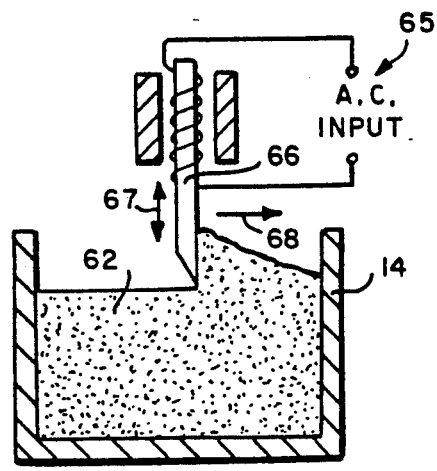
Figure 4:
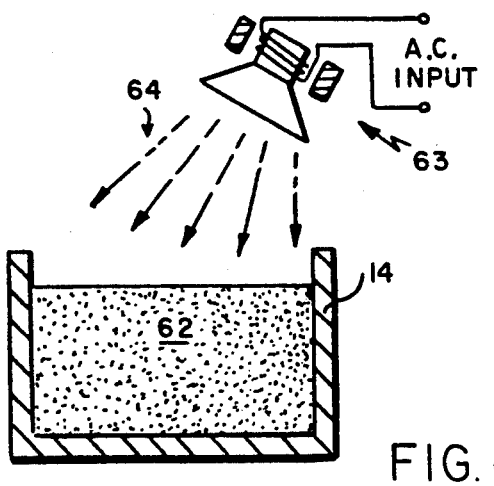

Such techniques are illustrated, for example, in FIGS. 3, 4 and 5, respectively. FIG. 3 shows form 14 which is mechanically vibrated as shown by arrow 60 using a vibrating transducer system 61 for settling the powder particles 62 therein. In FIG. 4 an acoustic transducer system 63 is used to supply acoustic energy 64 to the surface layer of powder 62 for such purpose. In FIG. 5 a vibrating tranducer system 65 is used to vibrate a piezoelectric scraper 66 as shown by arrow 67 as it moves in the exemplary direction of arrow 68 to settle the powder 62.

The powder may also be deposited in a dry or in a wet form using a drop piston approach wherein a dry or moist powder is deposited on the top of a vertically movable piston and the piston is moved downwardly into a chamber, excess powder being scraped off with a suitable scraper device.

Figures 6A, 6B, 6C, 6D:
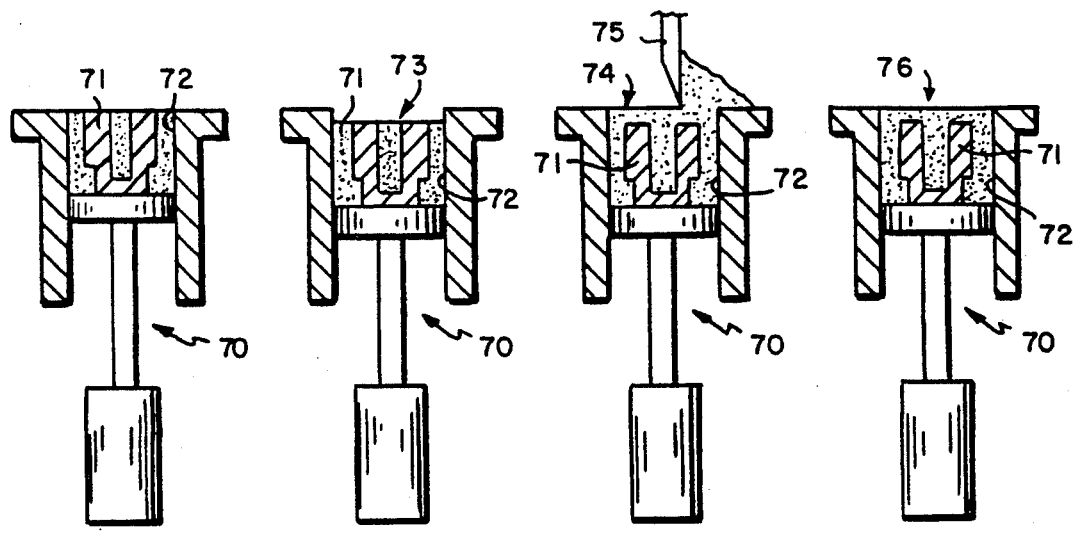
FIG. 6 shows exemplary stages in the use of a drop-piston device for depositing powder particles in accordance with the invention.

As shown in FIG. 6, a piston 70 holds the part 71 shown as partially formed within a chamber 72 at diagram (A). In order to deposit a layer of powder, the piston is moved downwardly in the chamber, leaving a region in chamber 73 at the top thereof for deposition of powder particles at diagram (B). Powder particles 74 are deposited in such region and a doctor blade 75, for example, is used to scrape off excess powder at diagram (C). The part 71 having the newly deposited layer 76 of powder thereon is then ready for the application of binder material thereto at diagram (D).

In general, it is found that larger particles, for example, of about 20 microns or greater in size, are preferably deposited in a dry state, while smaller particles, for example, of about 5 microns or smaller in size, can be deposited either in a dry state or in a wet state in a liquid vehicle.

Colloidal dispersions of particles can be obtained in a liquid vehicle by the addition of chemical dispersants. The liquid used in a wet powder dispersion technique is removed, or partially removed, before the next layer is deposited. Thus, such liquid is caused to evaporate rapidly before the ink-jet binder printing occurs. Such evaporation can be achieved, for example, by using infra-red heating, hot air heating or microwave heating techniques.

The ink-jet printing of the binder material should utilize droplets of materials the shrink characteristics of which are selected so that the dimensional tolerances of the part being made are maintained upon hardening thereof. While the binder solution must have a relatively high binder content, the viscosity thereof should be low enough so as to be able to flow through the printing head for deposit into the powder material. The binder material should be selected to penetrate the layer and to perform its binding action relatively rapidly in each layer so that the next layer of powder particles can be subsequently applied thereto. When using certain ink-jet technology the binder material may require at least a minimum electrical conductivity, particularly when using currently available continuous jet printing heads, for example, which require enough conductivity to establish charge on the binder solution droplets as they are emitted from the head. Where conductivity cannot be established in the binder, as with certain organic solvents, for example, the binder can be applied using drop-on-demand print heads.

The binder material may be such that the bonded particles have a high binding strength as each layer is deposited so that, when all the layers have been bonded, the component formed thereby is ready for use without further processing. In other cases, it may be desirable, or necessary, to perform further processing of the part. For example, while the process may be such as to impart a reasonable strength to the component which is formed, once the part is formed it can be further heated or cured to further enhance the binding strength of the particles. The binder in some cases can be removed during such heating or firing process, while in others it can remain in the material after firing. Which operation occurs depends on the particular binder material which has been selected for use and on the conditions, e.g., temperature, under which the heating or firing process is performed. Other post-processing operations may also be performed following the part formation.

The ink-jet printing mechanisms that can be used are known to the art and normally are of two types, one being a continous jet stream print head and the other a drop-on-demand stream print head. A high speed printer of the continous type, for example, is the Dijit printer made and sold by Diconix, Inc. of Dayton, Ohio, which has a line printing bar containing approximately 1500 jets which can deliver up to 60 million droplets per second in a continous fashion and can print at speeds up to 900 feet per minute. In such a system, the liquid material emerges continuously from each jet nozzle under high pressure, the jet stream then disintegrating into a train of droplets, the direction of which is controlled by electric control signals.

Drop-on-demand systems, as now known to the art, generally use two droplet generation mechanisms. One approach uses a piezoelectric element which in one exemplary embodiment has the piezoelectric element attached to one wall of a liquid reservoir. A pulse applied to the piezoelectric element slightly changes the volume of the reservoir cavity and simultaneously induces a pressure wave in the liquid. Such operation causes a droplet of the liquid to be ejected from a nozzle attached to the cavity. The cavity refills by capillary action. Another approach uses an evaporative bubble wherein a small resistive heater when actuated causes some of the liquid to evaporate so as to form a vapor bubble which in turn causes a small droplet of liquid to be ejected from the cavity. The cavity is then refilled through capillary action. In general, continuous jet technology provides higher droplet deposit rates than drop-on-demand technology.

The continuous or drop-on-demand ink-jet heads may use, for example, a single jet, or an array of jets which are arranged to deposit the material in an effectively linear manner, or a combination of two or more relatively short, parallel arrays of jets arranged for parallel and effectively linear depositions thereof.

The rate at which a ceramic, metal, plastic, or composite component can be made depends on the rates used to deposit the powder and to supply the binder liquid, and on the rate at which each bonded layer hardens as the layers are deposited one on the other.

If a dry powder dispersion is utilized, the powder application step is less significant as a limiting factor in determining the overall printing rate. If powder dispersion in a liquid vehicle is used, however, the layer must be at least partially dry prior to the ink-jet application of the binder material. The drying time will depend on the specific nature of the powder, binder, and solvent used.

The dimensions of the individual portions of the component being formed, sometimes referred to as the "feature" size thereof, is primarily dependent on the size of the binder droplets used, while the tolerance on such dimensions primarily depends on the degree of the reproducibility of the droplet spread characteristics of the binder material which is utilized.

Ink-jet printing of a liquid binder using currently known ink-jet devices can provide jet droplet sizes of as low as 15 microns, for example. It is possible that even smaller droplet sizes will be practical, with the lower limit on droplet size arising from surface energy considerations in the creation of new surface area and in the increased likelihood of the clogging of small jets.

Overall part tolerance will depend not only on drop spreading, but also on material shrinkage and the reproducibility of shrinkage characteristics as well. As an example, if the binder/powder combination shrinks by 1% and the shrinkage is reproducible to within 5% of its nominal value of 1%, an overall variation due to shrinkage can be approximately 0.0005 inches/inch. The actual shrinkage that occurs during binder curing or deposition is a relatively strong function of particle rearrangement. Dimensional tolerance and particle packing can be empirically determined for the best results in each case.

Alumina, zirconia, zircon (i.e., zirconium silicate), and silicon carbide are representative ceramic materials which can be bonded using the techniques of the invention. Both natural and synthetic dispersants are available for these materials in organic vehicles. For example, alumina is very effectively dispersed by glyceride surfactants in toluene/MEK solvents, as is used for casting thin sheets of particles in the production of dielectric substrates in the electronic packaging industry. Silicon carbide, for example, can be easily dispersed in hexane if small amounts of OLOA 1200 (as obtained, for example, from Chevron Chemical Co. Oronite Additives Div. of San Francisco, Calif.) are present. OLOA is primarily used as an additive in crank case oil where it acts as a dispersant for metal particles produced by engine wear.

Organic binders have been used in the ceramics industry and are typically polymeric resins obtained from a variety of sources. They can be either water soluble, such as celluosic binders, as used in extrusion technology, or they can be soluble in only volatile organic solvents, such as the butyral resins, as used in tape casting technology. The latter water soluble systems can be removed relatively quickly and seem particularly useful in the technique of the invention. Another type of organic binder would be a ceramic precursor material such as polycarbosilazane.

Inorganic binders are useful in cases where the binder is to be incorporated into the final component. Such binders are generally silicate based and are typically formed from the polymerization of silicic acid or its salts in aqueous solution. Another exemplary inorganic binder which can be used is TEOS (tetraethylorthosilicate). During drying, the colloidal silica aggregates at the necks of the matrix particles to form a cement-like bond. During firing, the silica flows and acts to rearrange the matrix particles through the action of surface tension forces and remains after firing. Soluble silicate materials have been used as binders in refractory castable materials, for example, and have the advantage, when used in the technique of the invention, of producing substantially the same type of molded refractory body that is used in the casting industry.

In some applications, it may be preferable that the binder harden relatively rapidly upon being deposited so that the next layer of particles placed on a surface of the previous layer is not subject to particle rearrangement due to capillary forces. Moreover, a hardened binder is not subject to contamination from solvents which may be used in powder deposition. In other cases, it may not be necessary that the binder be fully hardened between layers and a subsequent layer of powder particles may be deposited on a previous layer which is not yet fully hardened.

Where hardening occurs at the time the binder is deposited, thermal curing, i.e., evaporation of the binder carrier liquid, for such purpose would generally require that the component being formed be warmed as the printing of the binder material is performed, while the printhead itself is cooled so that unprinted binder material in the reservoir of the ink-jet head retains its desired properties. Such hardening can be achieved by heating the binder material indirectly, as by heating the overall apparatus in which the part is being formed using an appropriate external heat source, for example, or by heating the binder material directly as by applying hot air to the binder material or by applying infra-red energy or microwave energy thereto. Alternatively, a variety of thermally activated chemical reactions could also be used to harden the binder. For example, gelation of alkali silicate solutions can be made to occur by a change in pH accompanying the decomposition of organic reagents. Thus, a mixture of alkali silicate and formamide could be printed on to a hot component being formed. The rapid increase in temperature would greatly increase the formamide decomposition rate and, therefore, rapidly change the pH of the binder. Other thermally or chemically initiated techniques for hardening of the binder upon deposit thereof could be devised within the skill of those in the art.

While liquid and colloidal binder materials have been discussed above, in some applications binder material may be deposited in the form of binder particles entrained in a liquid. Such binder materials can be supplied via specially designed compound ink-jet structures capable of providing such entrained binder materials. An example of such a composite structure is discussed, for example, in the article "Ink-Jet Printing," J. Heinzle and C. H. Hertz, Advances In Electronics and Electron Physics, Vol. 65.

Moreover, in some applications in the fabrication of a part, the binder material which is used need not be a single binder material, but different binder materials can be used for different regions of the part being formed, the different materials being supplied by separate binder deposition heads. A dual head system is shown in FIG. 2 wherein a second head 43A is depicted in phantom therein at (B).

Many possible combinations of powder and binder materials can be selected in accordance with the invention. For example, ceramic powders or ceramic fibers can be used with either inorganic or organic binder materials or with a metallic binder material; a metal powder can be used with a metallic binder or a ceramic binder; and a plastic powder can be used with a solvent binder or a plastic binder, e.g., a low viscosity epoxy plastic material. Other appropriate combinations of powder and binder materials will occur to those in the art for various applications.

One useful application of the invention lies in the printing of molds for metal casting, particularly when the mold has a relatively complex configuration. Currently, complex, high precision castings are made by lost-wax casting, or investment casting. The process begins with the fabrication of an aluminum die which is used to mold wax positives of the part to be cast. The die is usually made by electric discharge machining. Wax positives are then made and connected together by hand with wax runner systems to form a tree. If the part is to have internal voids, a ceramic core is included in the wax positives. The tree is then dipped repeatedly into ceramic slurries with a drying cycle between each dipping operation. Following a final dry, the wax is melted and burned out of the shell mold and the mold is finally ready for casting. In its basic form, such lost-wax casting technique has long been used in the art.

With the technique of the invention, a ceramic shell mold can be fabricated directly to its final shape with no wax positives needed at all. The internal cavities can be fabricated by leaving the binder material out of these areas. The loose, unjointed powder will then wash out of the mold through the same passageways that will later admit molten metal in the final mold. FIGS. 7 and 8 show diagrammatic views of the formation of a part having reentrant features. Thus, in FIG. 7, the binder material is printed at three selected regions 20, 21 and 22 for an initial set of sequential layers, while, for a final set of sequential layers, the selected region 23 encompasses all three previously formed regions as shown in FIG. 8. For the printing of molds, typical powder materials, as discussed above, might include alumina, silica, zirconia, and zircon, for example. A typical binder would be colloidal silica. Moreover, the techniques of the invention can be used to form the cores only.

When making molds with core regions, it may be advantageous to use one particular binder material for the main body of the mold and a modified binder material in the core regions thereof, the depositing of the binder at the core regions requiring the use of a second printhead, for example. The technique of the invention has at least two advantages over lost-wax techniques for the creation of molds, one lying in the reduction in cost for small and moderate batches of parts and the other in the ability to produce a large variety of different molds and other parts with a relatively short turnaround time.

Figure 9:
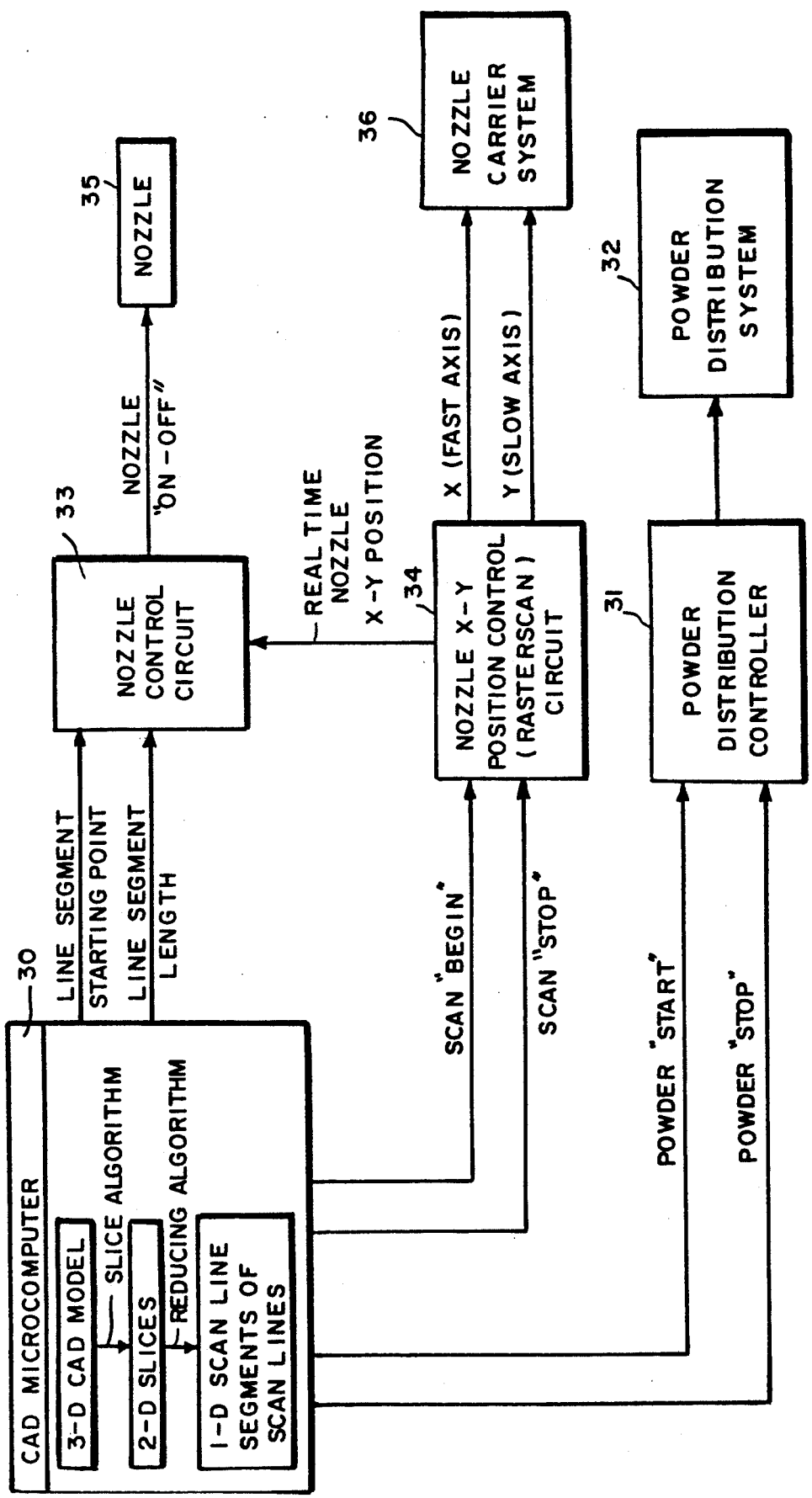
FIG. 9 shows a block diagram of an exemplary system which can be used in practicing the invention.
Figure 11:
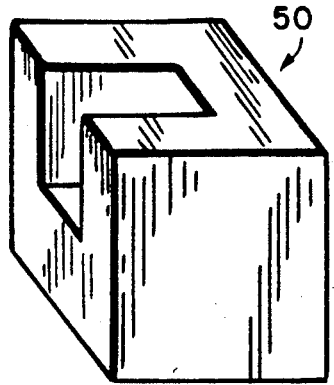
FIGS. 11 and 12 show isometric views of an exemplary 3-D model and the 2-D slices thereof, respectively, of a part to be formed in accordance with the invention.
Figure 12:
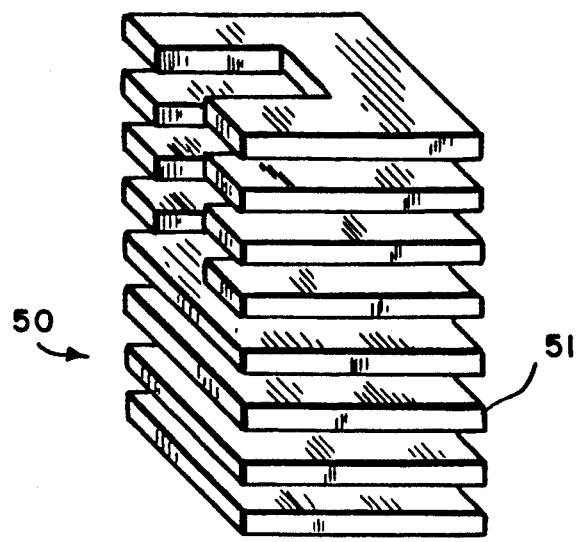

A relatively simple example of a system for performing the above powder distribution control operation and the nozzle control operation for the binder material is discussed with reference to the block diagram of FIG. 9 and the flow chart of FIG. 10. As seen in FIG. 9, a microcomputer 30 of any type which is usable for conventional computer-aided-design (CAD) operations, as would be well-known to the art, can be suitably programmed for the purpose of the invention. The microcomputer 30 is used to create a three-dimensional (3-D) model of the component to be made using well-known CAD techniques. An exemplary computerized 3-D model 50 is depicted in FIG. 11. A slicing algorithm is used to identify selected successive slices, i.e., to provide data with respect to selected 2-D layers, of the 3-D model 50 beginning at a bottom layer or slice thereof, for example. Exemplary layers 51 of the model 50 are depicted in the exploded view of FIG. 12. The development of a specific slicing algorithm for such purpose is well within the skill of those in the art.

Figure 13:
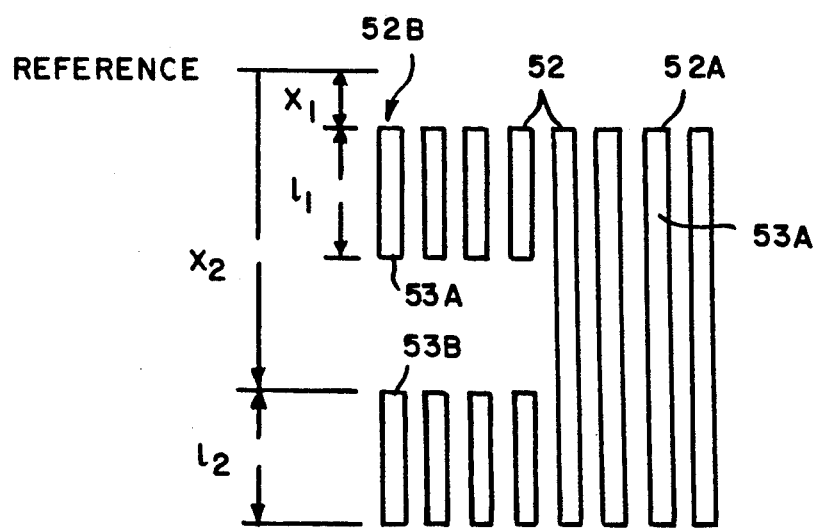
FIG. 13 shows a plan view of the 1-D line segments of a 2-D slice of the model shown in FIGS. 11 and 12.

Once a particular 2-D slice has been selected, the slice is then reduced to a series of one-dimensional (1-D) scan lines thereof as depicted in the plan view of FIG. 13. The development of a suitable reducing algorithm for such purpose would also be well within the skill of the art. Each of the scan lines 52 can comprise a single line segment (e.g., segment 53A of scan line 52A) or two or more shorter line segments, (e.g., segments 53B of scan line 52B), each line segment having a defined starting point on a scan line and a defined line segment length. For example, the line segments 53B have starting points at $x_1$ and $x_2$, respectively, as measured from a reference line 54, and lengths $l_1$ and $l_2$, respectively, as measured from their starting points $x_1$ and $x_2$.

The microcomputer 30 actuates the powder distribution operation when a particular 2-D slice of the 3-D model which has been created has been selected by supplying a powder "START" signal to a powder distribution controller circuit 31 which is used to actuate a powder distribution system 32 to permit a layer of powder for the selected slice to be deposited as by a powder head device in a suitable manner as discussed above. For example, the powder is deposited over the entire confined region within which the selected slice is located. Once the powder is distributed, the operation of powder distribution controller is stopped when the microcomputer 30 issues a powder "STOP" signal signifying that powder distribution over such region has been completed.

Microcomputer 30 then selects a scan line, i.e., the first scan line of the selected 2-D slice and then selects a line segment, e.g., the first 1-D line segment of the selected scan line and supplies data defining the starting point thereof and the length thereof to a binder jet nozzle control circuit 33. For simplicity in describing the operation it is assumed that a single binder jet nozzle is used and that such nozzle scans the line segments of a slice in a manner such that the overall 2-D slice is scanned in a conventional raster scan (X-Y) operation. When the real time position of the nozzle is at the starting point of the selected line segment, the nozzle 35 is turned on at the start of the line segment and is turned off at the end of the line segment in accordance with the defined starting point and length data supplied from computer 30 for that line segment. Each successive line segment is similarly scanned for the selected scan line and for each successive scan line of the selected slice in the same manner. For such purpose, the nozzle carrier system starts its motion with a scan "BEGIN" signal from microcomputer 30 so that it is moved both in the X axis (the "fast" axis) direction and in the Y axis (the "slow" axis) direction. Data as to the real time position of the nozzle carrier (and, hence, the nozzle) is supplied to the nozzle control circuit. When the complete slice has been scanned, a scan "STOP" signal signifies an end of the slice scan condition.

As each line segment is scanned, a determination is made as to whether nozzle operation has occurred for all line segments of a particular scan line of the selected slice. If not, the next line segment is scanned and the nozzle control operation for that line segment is performed. When nozzle operation for the final line segment of a particular scan line has been completed, a determination is made as to whether the scan line involved is the final scan line of the selected slice. If not, the next scan line is selected and the scanning and nozzle control process for each successive line segment of such scan line of the slice is performed. When nozzle operation for the final scan line of a particular slice has been completed, a determination is then made as to whether such slice is the final slice of the overall 3-D model. If not, the next slice is selected and the overall process for each line segment of such scan line thereof is repeated, including the powder deposition and nozzle binder deposition required for all the scan lines thereof. When the binder material has been supplied the final slice of the 3-D model, the operation is completed.

Figure 10:
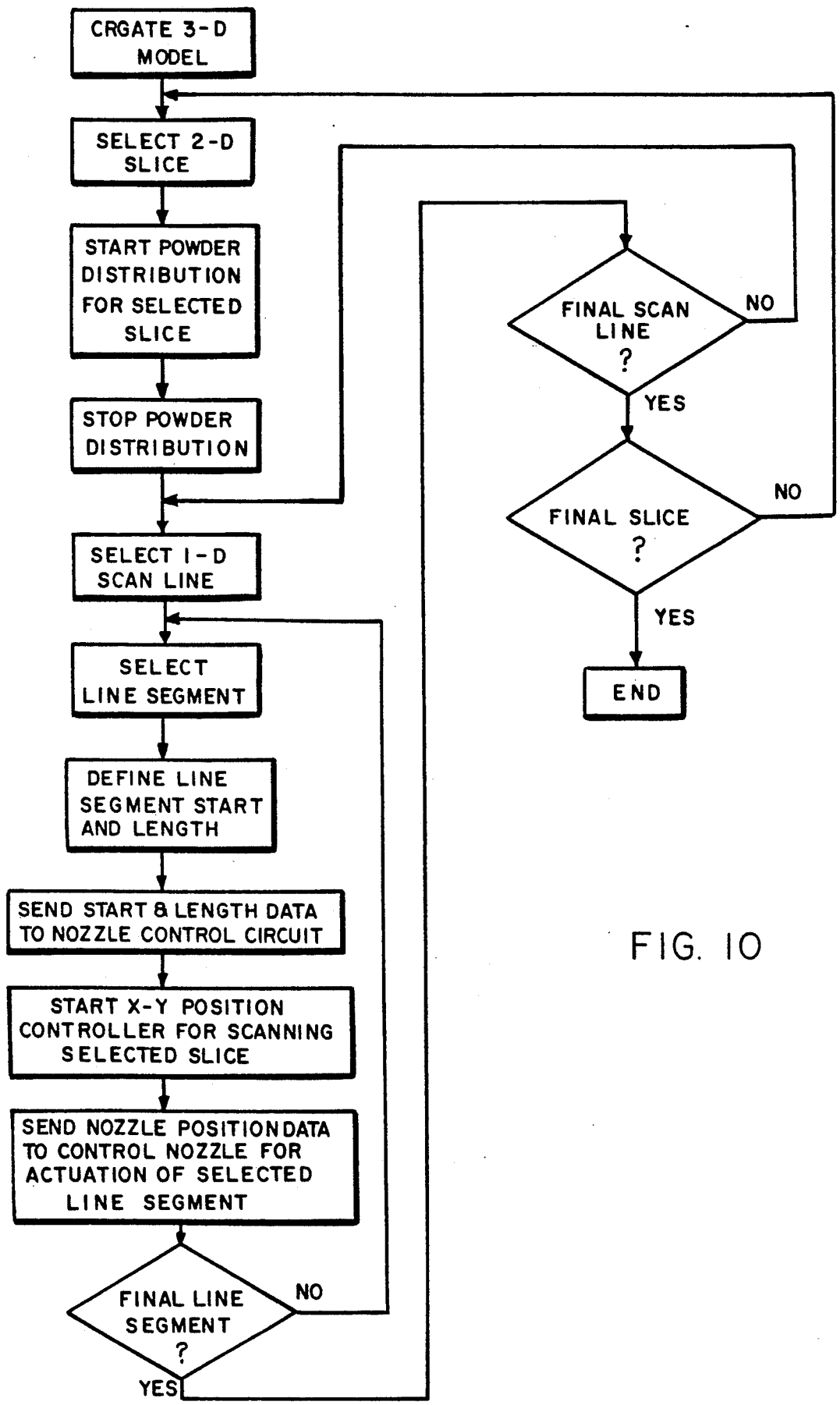
FIG. 10 shows an exemplary flow chart of the steps used in the system of FIG. 8 to practice the invention.

The necessary programming required to implement the flow chart of FIG. 10 using the components of FIG. 9 would be well within the skill of the art and need not be discussed in further detail. Such an approach can be used for a single nozzle as described above and can be readily adapted for use with a binder head having multiple nozzles, e.g., an array of nozzles for providing an effective linear deposition of binder material, or a plurality of relatively shorter, multiple arrays thereof.

In addition to the above discussed embodiments of the invention, further variations or modifications of the techniques disclosed above will occur to those in the art. For example, the binder, rather than being applied in a wet state, can be applied in a dry state using materials having a low melting point so that, when applied and heated, the melted material penetrates the powder particles and when hardened bonds them together. Further, two or more different types of powder particles can be applied via two or more separate powder dispersion heads so as to deposit the different powders at different regions of the part being formed. The powder at such regions can then be bonded using the same or different binder materials so that different physical characteristics can be obtained at such different regions. Other modifications or extensions of the invention may occur to those in the art within the spirit and scope thereof. Hence, the invention is not to be construed as limited to the specific embodiments described above, except as defined by the appended claims.

What is claimed is:

1. A process for making a component comprising the steps of
   (1) depositing a layer of a powder material in a confined region;
   (2) applying a further material to one or more selected regions of said layer of powder material which will cause said layer of powder material to become bonded at said one or more selected regions;
   (3) repeating steps (1) and (2) a selected number of times to produce a selected number of successive layers, said further material causing said successive layers to become bonded to each other;
   (4) removing unbonded powder material which is not at said one or more selected regions to provide the component.

2. A process in accordance with claim 1 wherein said powder material includes two different types of powder material.

3. A process in accordance with claim 1 wherein said powder material is a ceramic, metallic, or plastic material and said further material is an inorganic material, an organic material, or a metallic material.

4. A process in accordance with claim 1 wherein said powder material is a ceramic and said further material is a colloidal suspension of ceramic particles.

5. A process for making a component comprising the steps of
   (1) depositing in a confined region a layer of a fluent porous material having interconnected porosity;
   (2) applying to one or more selected regions of said layer of fluent porous material a further material which will cause said layer of fluent porous material to become bonded at said one or more selected regions;
   (3) repeating steps (1) and (2) a selected number of times to produce a selected number of successive layers, said further material causing said successive layers to become bonded to each other;
   (4) removing fluent porous material which is not at said one or more selected regions to provide the component.

6. A process in accordance with claim 5 wherein said porous material is a ceramic, metallic, or plastic material and said further material is an inorganic material, an organic material, or a metallic material.

7. A process in accordance with claim 6 wherein said porous material is a ceramic and said further material is a colloidal suspension of ceramic particles.

8. A process in accordance with claim 5 wherein the porosity of said component is determined in accordance with the packing density of said porous material.

9. A process in accordance with claims 1 or 5 wherein said further material is applied as one or more jet streams thereof.

10. A process in accordance with claim 9 and further including the step of further processing said bonded material to improve the properties of said component.

11. A process in accordance with claims 1 or 5 and further including the step of further processing said bonded material to improve the properties of said component.

12. A process in accordance with claim 11 wherein said further processing step includes the step of heating said selected number of successive layers of bonded material to further strengthen the bonding of said successive layers of bonded material.

13. A process in accordance with claim 1 or 5 wherein said material is deposited in a dry state.

14. A process in accordance with claim 13 and further including the step of vibrating said dry material to settle said material as said layers thereof are deposited.

15. A process in accordance with claim 14 wherein said vibrating step is performed by mechanical vibration of said deposited material, by applying accoustic energy to said deposited material, or by applying a piezoelectric scraper device to said deposited material.

16. A process in accordance with claim 1 or 5 wherein said material is deposited in a liquid vehicle.

17. A process in accordance with claim 16 and further including the step of at least partially drying the material before applying said further material.

18. A process in accordance with claim 17 wherein said at least partial drying step is performed by applying infra-red or hot air heat to said deposited layer of material or by applying microwaves to said deposited layer of material.

19. A process in accordance with claims 1 or 5 wherein said further material is applied as a liquid.

20. A process in accordance with claim 19 wherein said liquid is an aqueous solution or a colloidal suspension.

21. A process in accordance with claim 19 wherein said liquid comprises binder particles entrained in a carrier liquid.

22. A process in accordance with claims 1 or 5 wherein said further material comprises at least two different further materials, said two different further materials being applied to at least two different selected regions of said material.

23. A process in accordance with claims 1 or 5 wherein said further material is applied as a single jet stream.

24. A process in accordance with claim 23 where each of said one or more jet streams is applied as a plurality of separate droplets thereof.

25. A process in accordance with claims 1 or 5 wherein said further material is applied as a plurality of jet streams.

26. A process in accordance with claim 25 wherein each of said one or more jet streams of further material is applied as a continuous jet stream thereof.

27. A process in accordance with claim 25 wherein each of said one or more jet streams is applied as a plurality of separate droplets thereof.

28. A process in accordance with claim 27 wherein said separate droplets are applied using continuous jet printing or drop-on-demand jet printing.

29. A process in accordance with claim 25 wherein said plurality of jet streams are applied in one or more arrays thereof.

30. A process in accordance with claim 25 wherein said plurality of jet streams are applied in one or more linear arrays thereof.

31. A process in accordance with claim 1 or 5 wherein said further material is at least partially hardened after being applied.

32. A process in accordance with claim 31 wherein said further material is hardened by applying heat energy thereto.

33. A process in accordance with claim 32 wherein said heat energy is applied as infra-red or microwave heat energy.

34. A process in accordance with claim 31 wherein said further material is hardened by chemical reaction.

35. A process in accordance with claim 34 wherein said further material is at least partially hardened by chemical reaction after each layer of further material is applied, said powdered material being deposited in a wet state, and said chemical reaction occurring between said further material and the liquid in said wet powdered material.

36. A process in accordance with claim 34 wherein said further material is at least partially hardened by chemical reaction after each layer of further material is applied, and further including the step of supplying a gaseous material to said further material, said further material chemically reacting with said gaseous material to form a partially hardened material.

37. A process in accordance with claims 1 or 5 wherein said material which is removed is removed ultrasonically.

38. A process in accordance with claims 1 or 5 wherein said further material is applied in a dry state.

39. A process in accordance with claim 1 or 5 for making a mold having re-entrant regions and one or more passageways for the admission of molding material into said mold wherein said further material is not applied to said re-entrant regions and unbonded powder material is removed from said re-entrant regions via said passageways.

40. A process in accordance with claim 39 when said powder material is a ceramic powder material for forming a ceramic mold.

41. A process in accordance with claim 39 wherein said mold comprises a main body region and one or more core regions, one type of further material being applied to form said main body region and a different type of further material being applied to form said one or more core regions.

42. A process in accordance with claims 1 or 5 wherein said component is a mold.

* * * * *